United States Patent
Narasaki et al.

(10) Patent No.: US 9,766,287 B2
(45) Date of Patent: Sep. 19, 2017

(54) THERMAL CONTROL

(71) Applicant: Teradyne, Inc., North Reading, MA (US)

(72) Inventors: John Kenji Narasaki, Camarillo, CA (US); Kevin A. Thompson, Westlake Village, CA (US)

(73) Assignee: Teradyne, Inc., North Reading, MA (US)

( * ) Notice: Subject to any disclaimer, the term of this patent is extended or adjusted under 35 U.S.C. 154(b) by 40 days.

(21) Appl. No.: 14/520,571

(22) Filed: Oct. 22, 2014

(65) Prior Publication Data

US 2016/0116528 A1   Apr. 28, 2016

(51) Int. Cl.
*G01K 13/00*   (2006.01)
*G01R 31/28*   (2006.01)
*H01L 23/34*   (2006.01)

(52) U.S. Cl.
CPC .......... *G01R 31/2874* (2013.01); *H01L 23/34* (2013.01)

(58) Field of Classification Search
CPC ..... H01L 23/34; H01L 23/345; H01L 23/473; G01R 31/2874; G01R 31/2875; G01R 31/2877; B01L 2300/1822
USPC ......................................................... 324/750
See application file for complete search history.

(56) References Cited

U.S. PATENT DOCUMENTS

| | | | | |
|---|---|---|---|---|
| 6,389,225 B1 * | 5/2002 | Malinoski | .......... | G01R 31/2891 219/494 |
| 6,448,575 B1 * | 9/2002 | Slocum | .................. | H01L 23/34 257/48 |
| 6,629,638 B1 * | 10/2003 | Sanchez | ............... | G01R 31/002 235/454 |
| 2002/0145439 A1 * | 10/2002 | Gaasch | ................ | G01R 1/0458 324/750.09 |
| 2005/0030053 A1 * | 2/2005 | Beaman | ............. | G01R 31/2874 324/750.09 |
| 2006/0192580 A1 * | 8/2006 | Ono | ................... | G01R 31/2877 324/750.09 |
| 2006/0290370 A1 * | 12/2006 | Lopez | ................ | G01R 31/2874 324/750.09 |
| 2007/0057686 A1 * | 3/2007 | Suga | .................. | G01R 31/2875 324/750.07 |

(Continued)

OTHER PUBLICATIONS

Hittite Microwave Corporation, "GAAS MESFET MMIC 1 WATT Power Amplifier, DC—6 GHz", HMC637LP5/637LP5E Datasheet, [revision 03.1213] [online], retrieved on Jan. 15, 2015, 10 pages. Retrieved from: http://www.hittite.com/content/documents/data_sheet/hmc637.pdf.

(Continued)

*Primary Examiner* — Tung X Nguyen
*Assistant Examiner* — Akm Zakaria
(74) *Attorney, Agent, or Firm* — Choate, Hall & Stewart LLP; Paul Pysher

(57) ABSTRACT

An example test system includes: a heating mechanism; a cooling mechanism; an instrument module having one or more interfaces to receive signals from a device under test (DUT), where the instrument module includes one or more electrical components to affect the signals, where the instrument module is between the heating mechanism and the cooling mechanism, and where the heating mechanism and the cooling mechanism are each configured to operate to maintain the instrument module within a target temperature range.

19 Claims, 3 Drawing Sheets

(56) References Cited

U.S. PATENT DOCUMENTS

| | | | | |
|---|---|---|---|---|
| 2008/0050781 A1* | 2/2008 | Oldham | ............ | B01L 7/52 |
| | | | | 435/91.2 |
| 2010/0327891 A1* | 12/2010 | Hobbs | ............ | G01R 31/2874 |
| | | | | 324/750.03 |
| 2013/0113509 A1* | 5/2013 | Wu | ............ | G01R 31/2874 |
| | | | | 324/750.03 |
| 2013/0285686 A1* | 10/2013 | Malik | ............ | G01R 31/2875 |
| | | | | 324/750.05 |
| 2014/0203829 A1* | 7/2014 | Yamada | ............ | G01R 31/2874 |
| | | | | 324/750.08 |
| 2015/0369524 A1* | 12/2015 | Ikegami | ............ | F25B 23/00 |
| | | | | 165/61 |

OTHER PUBLICATIONS

Mohsen Esmailpour, "Do you really know the thermal conductivity of your boards?", 25th IEEE Semi-Therm Symposium, 2009, 10 pages.

Ziegler and Nichols, Optimum Settings for Automatic Controllers, J. Dyn. Sys., Meas., Control 115(2B), 220-222 (Jun. 1, 1993), 3 pages.

3M, "Novec Engineered Fluid HFE-7100 for Heat Transfer", HFE-7100 Datasheet, [Issued Jan. 2002], [online], retrieved on Jan. 15, 2015, 8 pages. Retrieved at: http://www.scribd.com/doc/49607345/TDS-HFE-7100-Heat-Transfer#scribd.

Flex Test Platform, Ultra Flex "UltraWave 12 G" Wireless Test Solution Offering Lowest Cost of Test and Fastest Time to Volume For RF SOC and SIP Technologies, Teradyne 2008, 2 pages.

\* cited by examiner

THERMAL CONTROL

TECHNICAL FIELD

This specification relates generally to thermal control of an instrument module during testing.

BACKGROUND

Automatic Test Equipment (ATE) refers to an automated, usually computer-driven, system for testing devices, such as semiconductors, electronic circuits, and printed circuit board assemblies. A device tested by ATE is generally referred to as a device under test (DUT). ATE typically includes a computer system and test instrument modules or a single device having corresponding functionality. It may be desirable to maintain the instrument modules within a specified temperature range during testing. Otherwise, the test results may be affected.

SUMMARY

An example test system includes: a heating mechanism; a cooling mechanism; and an instrument module having one or more interfaces to receive signals from a device under test (DUT), where the instrument module includes one or more electrical components to affect the signals, where the instrument module is between the heating mechanism and the cooling mechanism, and where the heating mechanism and the cooling mechanism are each configured to operate to maintain the instrument module within a target temperature range. The example test system may include one or more of the following features, either alone or in combination.

The instrument module may have a first surface and a second surface. The first surface and the second surface may face in opposite directions. The heating mechanism may be on one side of the first surface and the cooling mechanism may be on the other side of the second surface.

The heating mechanism may include a resistive heating mechanism. The resistive heating mechanism may include conductive traces contained therein to generate heat. The resistive heating mechanism may include: a heater containing the conductive traces; and a gasket structure for holding the instrument module. The gasket structure may be thermally-conductive and include one or more waveguides to conduct heat relative to the instrument module. The gasket structure may be between the heater and part of the instrument module.

The heating mechanism may include a Peltier-based device.

The cooling mechanism may include a cooling plate. The cooling plate may include one or more conduits containing liquid coolant. The cooling mechanism may include one or more pedestals. Each of the pedestals may provide a thermally-conductive path between the cooling plate and a corresponding electrical component on the instrument module to draw heat from the corresponding electrical component.

The test system may include: a gasket structure containing the one or more pedestals, where the gasket structure is thermally conductive and for holding the interface module; and a thermal interface material. The thermal interface material may be between the cooling plate and the instrument module.

The cooling mechanism may include a Peltier-based device.

The test system may include: a temperature sensor to sense a temperature at the instrument module; and a control system to control the heating mechanism based on the temperature sensed. The control system may include a proportional-integral-derivative (PID) controller to drive the heating mechanism based on the temperature sensed. The PID controller may perform pulse-width modulation (PWM) to drive the heating mechanism. The temperature sensor may include a thermistor that is on the instrument module.

The cooling mechanism may include a cooling plate. The cooling plate may include one or more conduits containing liquid coolant. The test system may include: a temperature sensor to sense a temperature of the coolant; and a control system to control the temperature of the liquid coolant based on the temperature sensed. The test system may include: a first control system to control the heating mechanism based on the temperature sensed; and a second control system to control the temperature of the liquid coolant based on the temperature sensed, where the first and second control systems are separate control systems.

The test system may include: gasket structures creating an enclosure for holding the instrument module. The gasket structures may provide shielding against electromagnetic radiation. The instrument module may be a microwave instrument.

During operation of the test system, relative to ground, the heating mechanism may be above the instrument module and the cooling mechanism may be below the instrument module. The instrument module may include one or more interfaces to exchange signals with one or more DUTs.

The test system may include: a thermistor to sense a temperature associated with the instrument module, where the thermistor is for providing one or more signals representing an average source path temperature for the one or more electrical components; and a proportional-integral-derivative (PID) controller to control the heating mechanism to a setpoint programmed into the PID controller based on the one or more signals.

Any two or more of the features described in this specification, including in this summary section, can be combined to form implementations not specifically described herein.

The test systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The test systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DETAILED DESCRIPTION

Manufacturers may test devices at various stages of manufacturing. Manufacturers have an economic incentive to detect and discard faulty components as early as possible in the manufacturing process. Accordingly, many manufacturers test integrated circuits at the wafer level, before a wafer is cut into die. Defective circuits are marked and generally discarded prior to packaging, thus saving the cost of packaging defective die. As a final check, many manufacturers test each finished product before it is shipped. Such a process tests parts in packages which have had additional expense added to them over bare die. So, having accurate test results reduces the need to discard valuable parts.

To test quantities of components, manufacturers commonly use ATE (or "testers"). In response to instructions in a test program set (TPS), some ATE automatically generates input signals to be applied to a device under test (DUT), and monitors output signals. The ATE compares the output signals with expected responses to determine whether the DUT is defective. ATE typically includes a computer system and a test instrument or a single device having corresponding functionalities. In some cases, the test instrument provides power to a DUT.

Also typically included with ATE is an interface, which may, or may not, be part of a device interface board (DIB). The interface may be configured (e.g., include one or more interfaces) to route signals between the ATE and one or more DUTs. In some implementations, the interface is configured to route signals between one or more ATE and one or more DUTs.

In an example implementation, ATE includes one or more instrument modules. The instrument modules include radio frequency and microwave test modules. Such instrument modules may be used to test RF and microwave characteristics of a DUT. Instrument modules may also be used to test other aspects of DUT operation, and are not limited to RF and microwave implementations. An example instrument module may include one or more connectors for connecting to one of more DUTs. The connectors may be coaxial connectors or any other appropriate type of connection devices.

Figure 1:
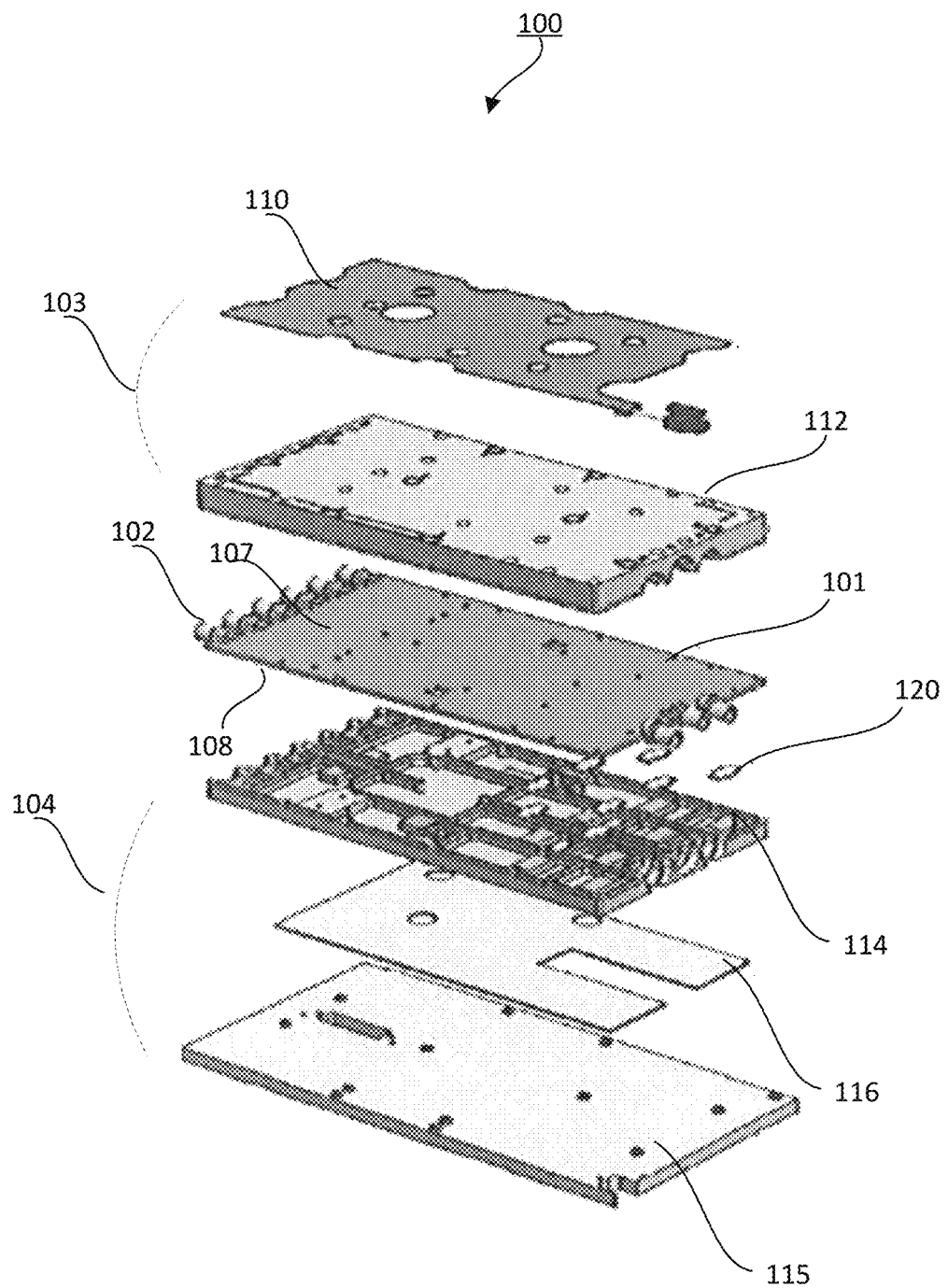
FIG. 1 is a diagram showing an example instrument module that includes an example thermal control system.

An example front-end microwave instrument module is shown in FIG. 1. Example instrument module includes printed circuit board (PCB 101). Mounted on the top and/or the bottom of PCB 101 are electrical components (not shown) which are used to drive, process, or otherwise affect electrical signals passing therethrough. Conductive traces (not shown) on the PCB enable transmission of electrical signals between connectors 102 and electrical components (not shown). Signals from outside of the instrument module (e.g., from a DUT) are exchanged via connectors 102. In some implementations, the electrical components may include, but are not limited to, one or more of the following: amplifiers, drivers, microcontrollers, processors, digital signal processors (DSPs), or the like.

The operation of example instrument module 100, and thus the accuracy of tests performed thereby, is susceptible to variations in temperature. For example, if the temperature of instrument module 100 exceeds a predetermined or maximum value, the electrical components, and thus the instrument module, may malfunction or provide readings that are inaccurate or outside of an acceptable tolerance. In some implementations, the instrument module should be regulated to, e.g., within 0.25° C. of a predetermined set point, e.g., 35° C., in order to ensure proper operation. In some implementations, these values may be different.

A number of factors can contribute to temperature fluctuations of individual components. These factors can include, but are not limited to: coolant temperature tolerance, ambient temperature variation, slot position within a test head, power variations, both at the component and module levels, the stuffing configuration within the test head, and front end module position on a portion of a cooling mechanism (described below).

In order to maintain the instrument module within an acceptable (e.g., operational) temperature range, the ATE includes a heating mechanism 103 and a cooling mechanism 104. Heating mechanism 103 is configured to increase the temperature of the instrument module, and cooling mechanism is configured to decrease the temperature of the instrument module. In some implementations, a temperature sensor (not shown), such as a thermistor, is resident on the PCB, and its output is used by control systems to control operation of the heating mechanism and the cooling mechanism to regulate the temperature of the instrument module.

In some implementations, PCB 101 is between heating mechanism 103 and cooling mechanism 104, and the heating mechanism and the cooling mechanism are each configured to operate to maintain the instrument module within a target temperature range. In some implementations, the module may be regulated irrespective ambient temperature. For example, as shown in FIG. 1, PCB 101 has a first surface (top) 107 and a second surface (bottom) 108. The first surface and the second surface face in opposite directions, and heating mechanism 103 is on a side of the first surface and cooling mechanism 104 is on a side of the second surface. During operation of the test system, relative to ground, the heating mechanism is above the instrument module and the cooling mechanism is below the instrument module.

The foregoing configuration can be advantageous in regulating the temperature of the instrument module. For example, segregating the heating mechanism from the cooling mechanism may reduce the thermal conductivity between the two devices, thereby reducing the chances that the heating will counteract the cooling and vice versa when the heating and cooling mechanisms operate concurrently. Furthermore, because the heating mechanism is above the cooling mechanism, in some cases it may be possible to exercise a greater degree of control over heating than if the heating mechanism were below the instrument board. Other advantages may also result from the configurations described herein.

In this example, the heating mechanism includes a heater 110 and an upper gasket structure 112. In this example, upper gasket structure 112 mates to lower gasket structure 114 to enclose PCB 101 and the electrical components mounted thereon. When mated, upper gasket structure 112 and lower gasket structure 114 form an enclosure or housing for PCB 101. In some implementations, the housing, comprised of the upper and lower gasket structures, forms an electromagnetic (EMI) shield for PCB 101. In this regard, each of the upper and lower gasket structures may be made of metal or other appropriate material capable of functioning as an EMI shield. Each of the upper and lower gasket structures is also made of a material, such as metal, that is thermally conductive.

In the example of FIG. 1, heater 110 is a resistive heater; however, in other implementations, different types of heaters may be used. For example, the heater may be a Peltier device or other appropriate heating system. In this example, heater 110 includes conductive traces for passing electrical current. The conductive traces have resistance that causes resistive heating in response to current passing through the conductive traces. The amount of heat generated is, in some cases, a function of the current through the conductive traces. This current may be controlled or regulated by a heater control system, such as that described below. The conductive traces may be made from copper or any other appropriate conductive substance.

Heater 110 may be fixed to a top of upper gasket structure using adhesive or other appropriate fastener. The part of upper gasket structure that faces PCB 101 includes waveguides in any appropriate arrangement to direct heat across a surface of PCB 101. More specifically, in operation of this implementation, current passing through heater 110 generates heat, which conducts through upper gasket structure 112. The heat passing through upper gasket structure 112 is directed by waveguides in the upper gasket structure across PCB 101 to heat PCB 101. As described above, a control mechanism controls the amount of current, and thus heating, based on a temperature of the PCB sensed by a temperature sensor.

Cooling mechanism includes a cooling plate 115. Cooling plate 115 is made of metal or other appropriate thermally-conductive material. Cooling plate 115 includes one or more conduits therethrough. These conduits hold a coolant, typically a liquid coolant. An example liquid coolant is hydrofluoroether (HFE); however, any appropriate liquid coolant may be used. In this example, the temperature of the liquid coolant may be controlled by a control system, such as that described below. In some implementations, the control system to control the temperature of the coolant may be a different control system that the control system used to control the heating mechanism. In some implementations, the same control system may be used to control both heating and cooling.

In some implementations, a Peltier-based cooling device may be substituted for cooling plate 115. In some implementations, different types of cooling structures may be used in place of the cooling plate.

Cooling mechanism 104 also includes a thermal interface material 116 located between cooling plate 115 and the lower gasket structure. In some implementations, the thermal interface material may be made from any compliant, thermally conductive and electrically isolating material. For example, the thermal interface material may be, or include, e.g., paraffin wax or silicone based materials. In some implementations, the thermal interface material may be omitted from the cooling mechanism. In some implementations, the thermal interface material may be made from any appropriate thermally conductive material such as, but not limited to, metal. The thermal interface material may be fastened between the cooling plate and the lower gasket structure using any appropriate fastener.

Thermally-conductive pedestals are arranged in contact with electrical components connected to the PCB. In some implementations, the pedestals are machined into 114 and 120 represents a thermal interface material between the pedestals and the PCB 101. In some implementations, the pedestals may be in direct contact with the cooling plate, or the pedestals may contact the thermal interface material 116 between the cooling plate and the electrical components, thereby creating a thermally-conductive path between the electrical components and the cooling plate. Heat from the electrical components passes through this thermally-conductive path to the cooling plate, thereby cooling the components.

In some implementations, the surfaces of the pedestals that contact the electrical components have surface areas that are about the same sizes as the contact surface areas of the electrical components, thereby promoting heat dissipation at a greater rate than with smaller surface areas.

In some implementations, PCB 101 includes one or more temperature sensors to sense a temperature at, or of, the instrument module. In some implementations, the temperature sensor includes a thermistor that is on the instrument module or close enough to the instrument module to sense its temperature or a temperature at the instrument module. The thermistor may sense temperature associated with the instrument module (e.g., the temperature of, at, or within a range of, the instrument module). The thermistor may provide one or more signals representing an average source path temperature for the one or more electrical components.

The sensed temperature may be used to control the heating and the cooling, either simultaneously or separately. For example, in response to determining that the temperature of the electrical components is below a defined threshold, the heating mechanism may be activated, or increased, to add heat to the components. By contrast, in response to determining that the temperature of the electrical components is above a defined threshold, the cooling mechanism may be activated, or increased, to remove heat from the electrical components. In this regard, in some implementations, the cooling mechanism can be controlled, but may always provide some cooling simply by virtue of the physical connection between the pedestals and the electrical components. Accordingly, in some implementations, the heating mechanism may operate to counteract effects of the cooling mechanism.

In some implementations, there are two control systems: one control system for the heating mechanism and one control system for the cooling mechanism. For example, the control system for heating may include a control mechanism implemented, at least in part, by a proportional-integral-derivative (PID) controller to drive the heating mechanism based on the temperature sensed. In some implementations, the PID controller performs pulse-width modulation (PWM), based on one or more signals from the thermistor (e.g., one or more signals representing an average source path temperature for one or more electrical components) to drive the heating mechanism to a set temperature. In an example, the output duty cycle of the heater 110 is between 10% and 90% to avoid, or at least reduce, nonlinearities in driving field effect transistor (FET) devices. The set temperature may be the temperature calculated, e.g., by one or more computing devices, to achieve an appropriate electrical component temperature. The set temperature may be programmed into a control loop of the PID, and the PWM may continue until the sensed temperature reaches the set temperature. In an example implementation, the PID is a closed loop, the tuning for which is achieved by using a modified Ziegler-Nichols approach to determine the closed-loop tuning parameters.

Figure 2:
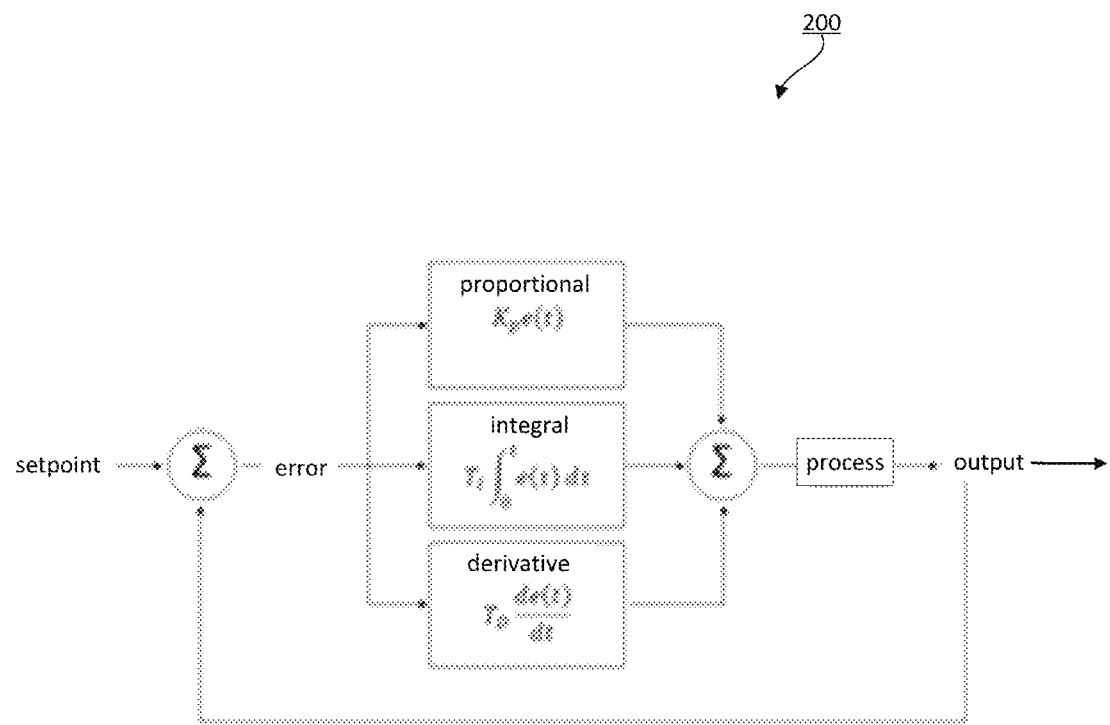
FIG. 2 is a block diagram showing an example proportional-integral-derivative control loop for use with the example control system.

An example closed loop PID 200 takes the form shown in FIG. 2 where e(t) is equal to the error between the setpoint and the real value. In an example implementation, in the PID controller used herein, the integral term is multiplied by the time step and the derivative term is divided by the time step.

In some implementations, the control system for cooling may include a control mechanism configured to control a temperature of the coolant used in the cooling plate. In this regard, as noted above, the cooling plate may contain one or more conduits containing liquid coolant, such as HFE, water, or other coolant. In some implementations, the coolant may be non-liquid. In any case, the control system for the cooling mechanism is configured to increase or decrease the temperature of the coolant to drive the cooling mechanism to a set temperature. The set temperature may be the temperature calculated, e.g., by one or more computing devices, to achieve an appropriate electrical component temperature. In some implementations, the temperature of the coolant may be controlled, e.g., through a computer-controlled refrigeration mechanism (not shown), that is responsive to signals from the control system that are based on the sensed temperature.

In the example implementations described herein, by moving the heater to the top of the instrument module, thermal impedance of the heater between the cold plate and module can be reduced. This configuration may also reduce inefficiencies associated with any heat lost directly into the cold plate. Furthermore, less power was dissipated by the cold plate to counteract heating from the heater. This may allow for faster response and tighter control tolerances.

As noted above, the example techniques described herein may be implemented, at least in part, on ATE. In an example operation, ATE (also referred to as "testers" or "test systems") operates in accordance with instructions in a test program set (TPS) to automatically generate input signals to be applied to a DUT, and to monitor output signals from the DUT. The ATE compares the output signals with expected responses to determine whether the DUT is defective. ATE typically includes a computer system and a test instrument or a single device having corresponding functionalities.

Figure 3:
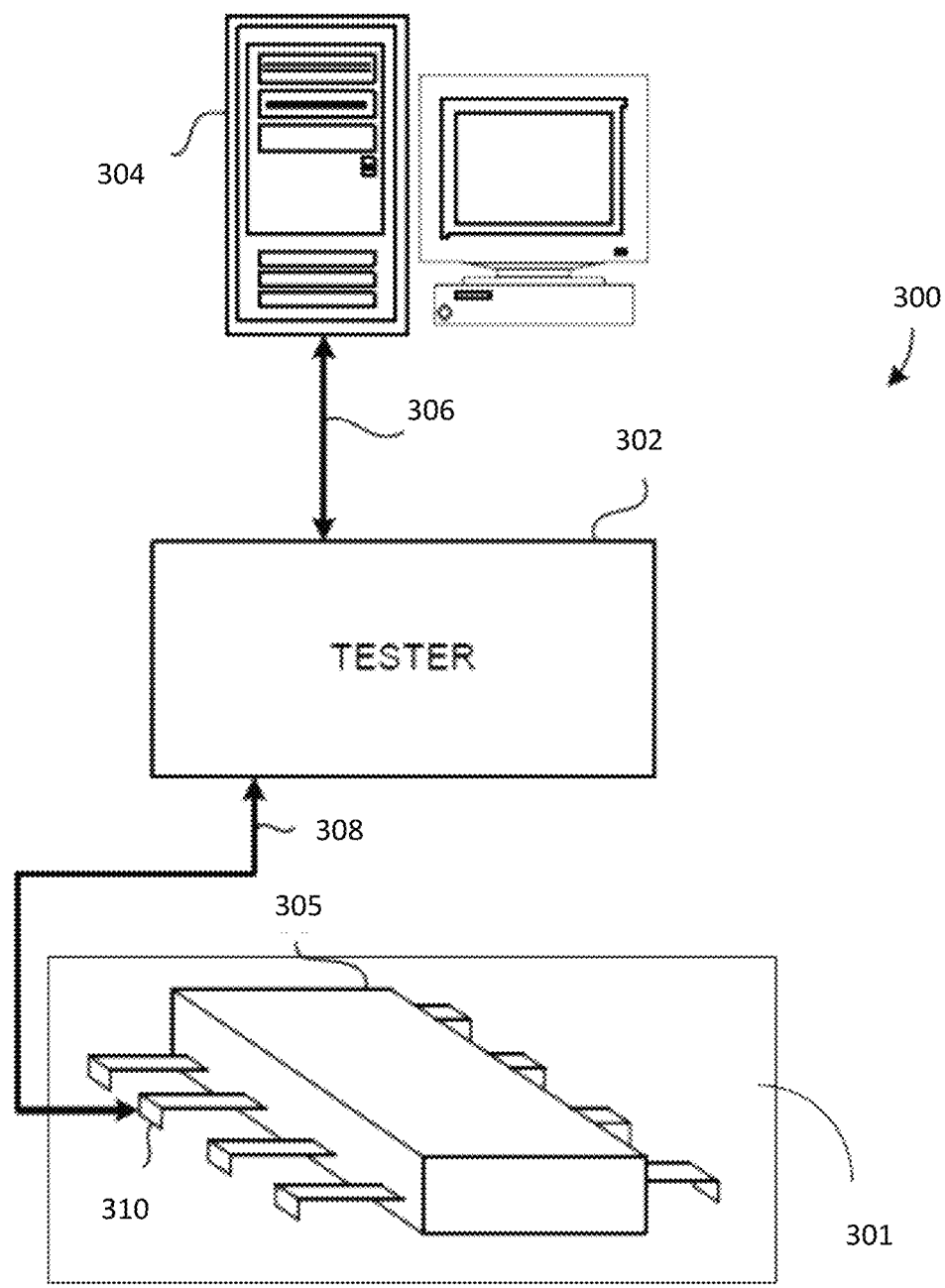
FIG. 3 is a block diagram of an example test system, which includes an example instrument module of the type described herein.

Referring to FIG. 3, an example ATE system 300 for testing a DUT 305 includes a tester (or "test instrument") 302. Tester 302 may include one or more of the example instrument modules described herein (e.g., the instrument module of FIG. 1). DUT 305 may be interfaced to a DIB 301, which may interface to one or more of the example instrument modules of the type described herein to send signals to, and receive signals, from the DUT.

Tester 302 may include a number of channels. To control tester 302, system 300 includes a computer system 304 that interfaces with tester 302 over a hardwire connection 306. In an example operation, computer system 304 sends commands to tester 302 to initiate execution of routines and functions for testing DUT 305. Such executing test routines may initiate the generation and transmission of test signals to the DUT 305 and collect responses from the DUT (e.g., via an instrument module). Various types of DUTs may be tested by system 300. In some implementations, the DUTs may be RF, microwave, or other wireless devices. In some implementations, the DUT may be any appropriate semiconductor or other device, such as an integrated circuit (IC) chip (e.g., memory chip, microprocessor, analog-to-digital converter, digital-to-analog converter, etc.) or other devices.

To provide test signals and collect responses from the DUT, tester 302 is connected to an interface to the internal circuitry of DUT 305. For example, the DUT may be inserted into a socket in DIB 301, which contains interfaces to electrical connections between the DUT and an instrument module in the tester. A conductor 308 (e.g., one or more conductive pathways) is connected to the interface and is used to deliver test signals (e.g., switching or DC test signals, etc.) to the internal circuitry of DUT 305. Conductor 308 also senses signals in response to the test signals provided by tester 302. For example, a voltage signal or a current signal may be sensed at pin 310 in response to a test signal and sent over conductor 308 to tester 302 for analysis. Such single port tests may also be performed on other pins included in DUT 305. For example, tester 302 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 308 to pin 310 for storing a digital value on DUT 305. Once stored, DUT 305 may be accessed to retrieve and send the stored digital value over conductor 308 to tester 302. The retrieved digital value may then be identified to determine if the proper value was stored on DUT 305.

Along with performing single port measurements, a two-port or multi-port test may also be performed by tester 302. For example, a test signal may be injected over conductor 308 into pin 310 and a response signal may be collected from one or more other pins of DUT 305. This response signal may be provided to tester 302 to determine quantities, such as gain response, phase response, and other throughput measurement quantities. Other tests may also be performed.

While this specification describes example implementations related to "testing" and a "test system," the devices (e.g., instrument module 100) and methods (e.g., control processes) described herein may be used in any appropriate system, and are not limited to test systems or to the example test systems described herein.

The example control systems and testing performed as described herein may be implemented using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

The example control systems and testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the example control systems and testing described herein can be performed by one or more programmable processors executing one or more computer programs to perform the functions described herein. All or part of the example control systems and testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals (including wireless signals) to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A test system comprising:
    a heating mechanism;
    a cooling mechanism; and
    an instrument module comprising one or more interfaces to receive signals from a device under test (DUT), the DUT being external to the instrument module, the instrument module comprising one or more electrical components to affect the signals, the instrument module being between the heating mechanism and the cooling mechanism;
    wherein the heating mechanism is configured to apply heat to a top surface of the instrument module, and the cooling mechanism is configured to cool a bottom surface of the instrument module, the heating mechanism and the cooling mechanism are configured to operate to maintain the instrument module within a target temperature range, and the top and bottom surfaces are relative to ground.

2. The test system of claim 1, wherein the top surface and the bottom surface face in opposite directions, the heating mechanism being on a side of the top surface and the cooling mechanism being on a side of the bottom surface.

3. The test system of claim 1, wherein the heating mechanism comprises a resistive heating mechanism, the resistive heating mechanism comprising conductive traces contained in the resistive heating mechanism to generate heat.

4. The test system of claim 3, wherein the resistive heating mechanism comprises:
    a heater containing the conductive traces; and
    a gasket structure for holding the instrument module, the gasket structure being thermally-conductive and comprising one or more waveguides to conduct heat relative to the instrument module, the gasket structure being between the heater and part of the instrument module.

5. The test system of claim 1, wherein the heating mechanism comprises a Peltier-based device.

6. The test system of claim 1, wherein the cooling mechanism comprises a cooling plate, the cooling plate comprising one or more conduits containing liquid coolant.

7. The test system of claim 6, wherein the cooling mechanism comprises one or more pedestals, each of the pedestals to provide a thermally-conductive path between the cooling plate and a corresponding electrical component on the instrument module to draw heat from the corresponding electrical component.

8. The test system of claim 6, further comprising:
    a gasket structure containing the one or more pedestals, the gasket structure being thermally conductive and holding the instrument module; and
    a thermal interface material;
    wherein the thermal interface material is between the cooling plate and the instrument module.

9. The test system of claim 6, wherein the cooling mechanism comprises a Peltier-based device.

10. The test system of claim 1, further comprising:
    a temperature sensor to sense a temperature at the instrument module; and
    a control system to control the heating mechanism based on the temperature sensed.

11. The test system of claim 10, wherein the control system comprises a proportional-integral-derivative (PID) controller to drive the heating mechanism based on the temperature sensed, the PID controller performing pulse-width modulation (PWM) to drive the heating mechanism.

12. The test system of claim 10, wherein the temperature sensor is a thermistor that is on the instrument module.

13. The test system of claim 1, wherein the cooling mechanism comprises a cooling plate, the cooling plate comprising one or more conduits containing liquid coolant, and wherein the test system further comprises:
    a temperature sensor to sense a temperature of the liquid coolant; and
    a control system to control the temperature of the liquid coolant based on the temperature sensed.

14. The test system of claim 1, wherein the cooling mechanism comprises a cooling plate, the cooling plate comprising one or more conduits containing liquid coolant, and wherein the test system further comprises:
    a temperature sensor to sense a temperature at the instrument module;
    a first control system to control the heating mechanism based on the temperature sensed; and
    a second control system to control the a temperature of the liquid coolant based on the temperature sensed, the first and second control systems being separate control systems.

15. The test system of claim 1, further comprising gasket structures creating an enclosure for holding the instrument module, the gasket structures providing shielding against electromagnetic radiation.

16. The test system of claim 1, wherein the instrument module comprises a microwave instrument.

17. The test system of claim 1, wherein the instrument module comprises one or more interfaces to exchange signals with one or more DUTs.

18. The test system of claim 1, further comprising:
    a thermistor to sense a temperature associated with the instrument module, the thermistor providing one or more signals representing an average source path temperature for the one or more electrical components; and a proportional-integral-derivative (PID) controller to control the heating mechanism to a setpoint programmed into the PID controller based on the one or more signals.

19. The test system of claim 1, wherein the top surface and the bottom surface face in different directions.

* * * * *